(12) United States Patent
Akutsu

(10) Patent No.: US 11,968,781 B2
(45) Date of Patent: Apr. 23, 2024

(54) PRINTED CIRCUIT BOARD AND DISK DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kazuyoshi Akutsu, Inagi Tokyo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 60 days.

(21) Appl. No.: 17/899,385

(22) Filed: Aug. 30, 2022

(65) Prior Publication Data

US 2023/0309224 A1    Sep. 28, 2023

(30) Foreign Application Priority Data

Mar. 23, 2022    (JP) ................. 2022-047121

(51) Int. Cl.
*H05K 1/11* (2006.01)
*G11B 5/82* (2006.01)
*H05K 1/02* (2006.01)

(52) U.S. Cl.
CPC ............... *H05K 1/111* (2013.01); *G11B 5/82* (2013.01); *H05K 1/0295* (2013.01); *H05K 2201/09954* (2013.01)

(58) Field of Classification Search
CPC ........ H05K 1/11; H05K 1/111; H05K 1/0295; H05K 2201/09954; G11B 5/82
USPC ......................................................... 174/260
See application file for complete search history.

(56) References Cited

U.S. PATENT DOCUMENTS

| 7,916,495 | B2 | 3/2011 | Huang |
| 9,277,648 | B2 | 3/2016 | Hamao et al. |
| 11,178,760 | B2 | 11/2021 | Ishizaki et al. |

*Primary Examiner* — Tremesha S Willis
(74) *Attorney, Agent, or Firm* — Kim & Stewart LLP

(57) ABSTRACT

According to one embodiment, a printed circuit board includes a substrate and a shared pad group provided on the substrate and including a plurality of shared pads. The shared pads include a first area, a second area smaller in size than the first area, a port of which is overlap the first area and an other port of which is located to protrude from the first area to a side of another one of the shared pads, and a second side edge located on a side of another shared pad. The second pad side edge includes a first side edge defining the first area, a second side edge defining the second area and displaced on a side of another shared pad with respect to the first side edge, and a sloping side edge connecting the first side edge and the second side edge to each other.

14 Claims, 7 Drawing Sheets

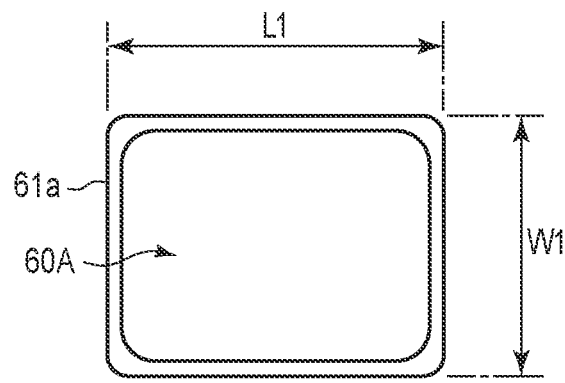
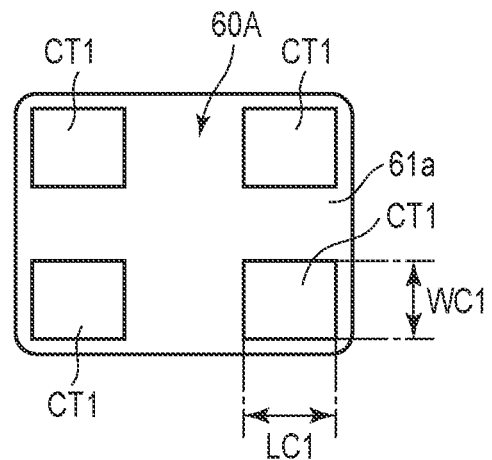
FIG. 3A  FIG. 3B
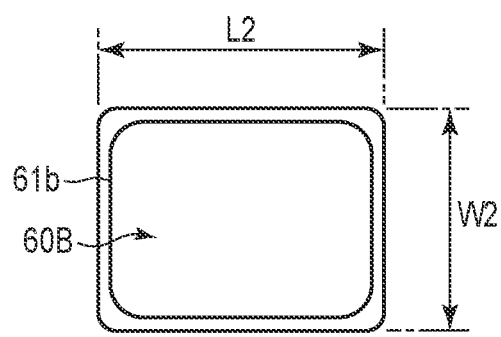
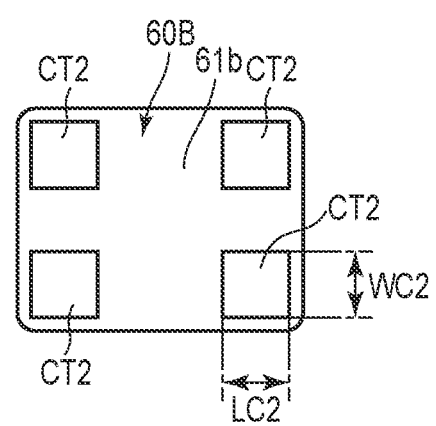
FIG. 4A  FIG. 4B

PRINTED CIRCUIT BOARD AND DISK DEVICE

CROSS-REFERENCE TO RELATED APPLICATIONS

This application is based upon and claims the benefit of priority from Japanese Patent Application No. 2022-047121, filed Mar. 23, 2022, the entire contents of which are incorporated herein by reference.

FIELD

Embodiments described herein relate generally to a printed circuit board and a disk device comprising the same.

BACKGROUND

As a disk device, for example, a hard disk drive (HDD) generally comprises a housing containing a disk-medium, a magnetic head and an actuator which moves the magnetic head and a printed circuit board (PCB) disposed to oppose the bottom surface of the housing. On the printed circuit board (PCB), a plurality of semiconductor devices and electronic components such as connectors are mounted. In many cases, the electronic components include parts of sizes different from each other.

Usually, in printed circuit boards, for mounting multiple electronic components of different sizes on pads of a common size, shared pads of the maximum size which is compatible with the electronic component of the maximum dimensions are used. However, when the shared pads are formed into a rectangular shape with the maximum size, solder balls are likely to be generated and misalignment in mounting may occur during mounting large-sized electronic components on the shared pads. When the misalignment in mounting is slight, it may not cause problems in function, but the inspection for misalignment is time-consuming.

BRIEF DESCRIPTION OF THE DRAWINGS

FIG. 3A is a plan view showing an upper surface side of a first electronic component to be mounted on the printed circuit board.

FIG. 3B is a plan view showing a rear surface side of the first electronic component.

FIG. 4A is a plan view of an upper surface side of a second electronic component to be mounted on the printed circuit board.

FIG. 4B is a plan view showing a rear surface side of the second electronic component.

DETAILED DESCRIPTION

Figure 1:
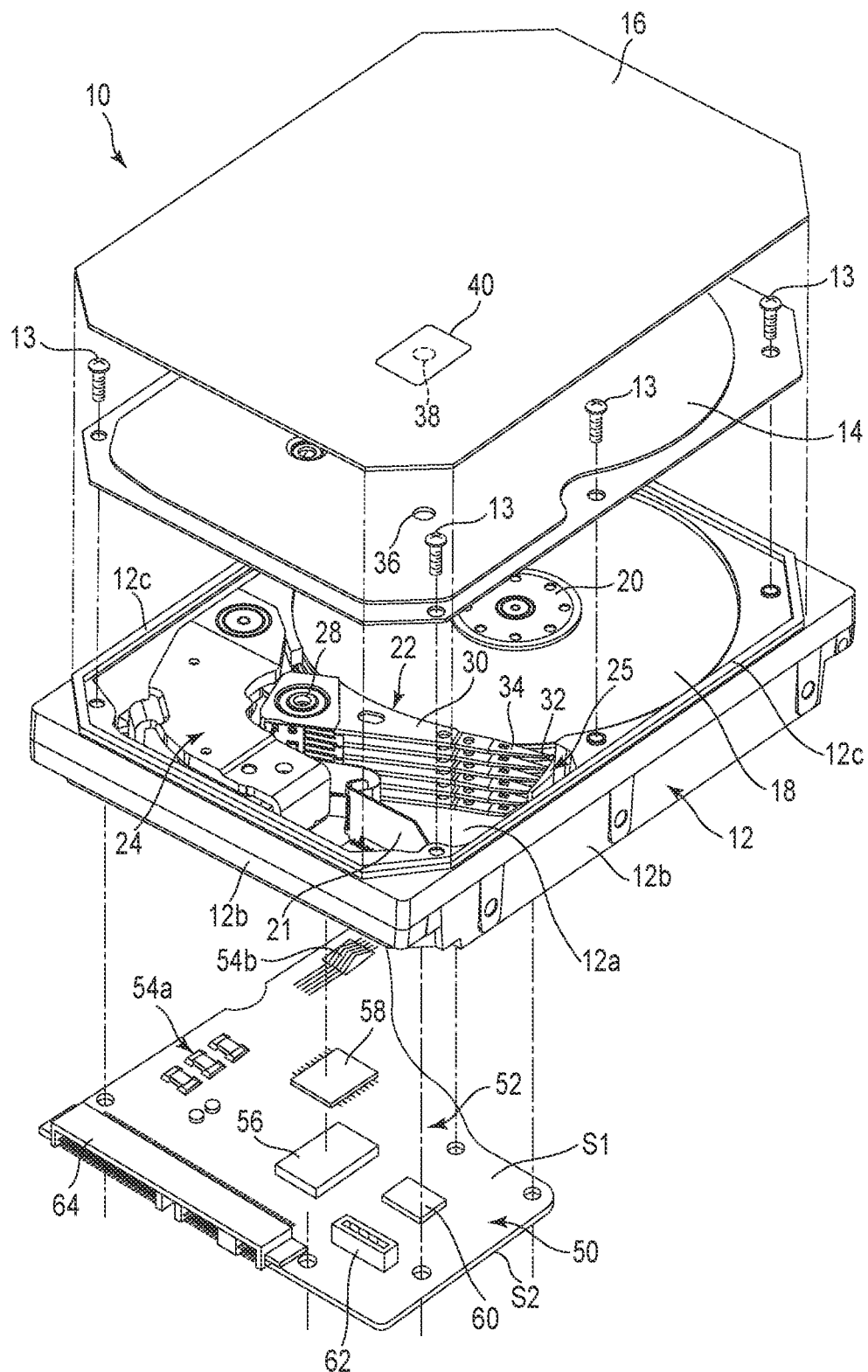
FIG. 1 is an exploded view schematically showing a hard disk drive (HDD) according to an embodiment.

Various embodiments will be described hereinafter with reference to the accompanying drawings. In general, according to one embodiment, a printed circuit board comprises a substrate; and a shared pad group provided on the substrate and including a plurality of shared pads. The plurality of shared pads each comprises a first area, a second area smaller in size than the first area, a port of which is located to overlap the first area and an other port of which is located to protrude from the first area to a side of another one of the shared pads, a first pad side edge extending in a first direction and defining the first area and the second area, and a second pad side edge extending in a second direction intersecting the first direction and defining the first area and the second area. The first pad side edge includes a first side edge defining the first area, a second side edge defining the second area and displaced on a side of another shared pad with respect to the first side edge, and a sloping side edge connecting the first side edge and the second side edge to each other.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Embodiments

As an example of the magnetic disk devices, a hard disk drive (HDD) according to an embodiment will be described in detail.

FIG. 1 is an exploded perspective view of an HDD according to an embodiment. As shown in the figure, the HDD comprises a substantially rectangular-shaped housing 10. The housing 10 includes a rectangular box-shaped base 12 with an upper opening, an inner cover 14 screwed to the base 12 with a plurality of screws 13 and closes the upper end opening of the base 12, and an outer cover (a top cover) 16 disposed over the inner cover 14, with a peripheral portion thereof welded to the base 12. The base 12 includes a rectangular bottom wall 12a opposing the inner cover 14 with a gap therebetween and side walls 12b provided to stand along the periphery of the bottom wall 12a, which are formed of, for example, aluminum to be integrated as one body. The side walls 12b include a pair of long side walls opposing each other and a pair of short side walls opposing each other. On the upper end surfaces of side walls 12b, a fixation rib 12c of substantially a rectangular frame shape is provided to protrude.

The inner cover 14 is formed of, for example, stainless steel into a rectangular plate shape. The inner cover 14 includes a peripheral portion screwed to the upper surfaces of the side walls 12b of the base 12 by the screws 13 and fixed to an inner side of the fixation rib 12c. The outer cover 16 is formed of, for example, aluminum into a rectangular plate shape. The outer cover 16 is formed to have slightly greater planar dimensions than those of the inner cover 14. The outer cover 16 is hermetically fixed as its peripheral portion is welded to the fixation rib 12c of the base 12 over its entire circumference.

In the inner cover 14 and the outer cover 16, ventilation holes 36 and 38 are respectively formed to communicate the inside of the housing 10 to the outside. The air inside the housing 10 is exhausted through the ventilation holes 36 and 38, and further, through these ventilation holes 36 and 38, a low-density gas (inert gas), which has a density lower than that of air, for example, helium, is sealed thereon. On an outer surface of the outer cover 16, for example, a seal (sealant) 40 is affixed to close the ventilation hole 38.

In the housing 10 are provided a plurality of, for example, five to ten magnetic disks as recording media, and a spindle motor 20 as a drive unit which supports and rotates the magnetic disks 18. The spindle motor 20 is placed on the bottom wall 12a. The magnetic disks 18 are each formed to have a diameter of, for example, 95 mm (3.5 inches) and include a magnetic recording layer on an upper surface and/or a lower surface thereof. The magnetic disks 18 are fitted to the hub (not shown) of the spindle motor 20 to be coaxial with each other and are clamped by a clamp spring, to be fixed to the hub. The magnetic disks 18 are supported while being positioned parallel to the bottom wall 12a of the base 12. The magnetic disks 18 are rotated by the spindle motor 20 at a predetermined speed.

Note that in this embodiment, five to ten magnetic disks 18 are contained in the housing 10, but the number of magnetic disks 18 is not limited to this. For example, a single magnetic disk 18 may was well be contained in the housing 10.

The housing 10 contains therein a plurality of magnetic heads 32 which record and reproduce information with respect to the magnetic disks 18 and an actuator assembly 22 which supports the magnetic heads 32 movably with respect to the magnetic disks 18, respectively. Further, in the housing 10 are provided a voice coil motor(, which will be referred to as VCM, hereinafter) 24 which rotates and positions the actuator assembly 22, a ramp load mechanism 25 which holds the magnetic heads 32 at an unload position spaced apart from the respective disks 18 when the of the magnetic disks 18, and a board unit (wiring member) 21 on which electronic components such as conversion connectors are mounted. The board unit 21 is formed from a flexible printed circuit board (FPC). This FPC is electrically connected to the voice coil of the VCM 24, and is electrically connected to the magnetic heads 32 via a wiring member (flexure) provided in the actuator assembly 22.

The actuator assembly 22 comprises an actuator block containing a rotatable bearing unit 28, a plurality of arms 30 extending from the actuator block 30 and a suspension assembly 34 extending from each arm 30. A magnetic head 32 is supported at a distal end portion of each suspension assembly 34.

As shown in FIG. 1, a control circuit board (printed circuit board) 50 is disposed to oppose an outer surface of the bottom wall 12a of the base 12. The control circuit board 50 is screwed to the bottom wall 12a with a plurality of screws 52 and opposed to the outer surface of the bottom wall 12a with a gap therebetween. The control circuit board 50 is formed into substantially a rectangular plate shape, and includes a first main surface S1 opposing the bottom wall 12a and a second main surface S2 on an opposite side.

On the first main surface S1 of the control circuit board 50, a plurality of electronic components 52 are mounted. For example, a plurality of semiconductor chips 54a, a plurality of semiconductor elements, such as a controller IC (system-on-chip (SoC)) 56, a large-scale integrated circuit (LSI) 58, a basic clock oscillation source (oscillator or resonator) 60, and a relay connector 62 connectable to the board unit 21, are mounted. On the first main surface S1, connection terminals 54b for the spindle motor 15 are provided. Further, on a side edge portion of the control circuit board 50, an interface connector 64 connectable to an external device is mounted.

In a state where the control circuit board 50 is mounted in a predetermined position on the base 12, the relay connector 62 is connected to a connector (not shown) provided on the bottom wall 12a. This connector is connected to the conversion connector of the board unit 21. Further, the connection terminals 54b are connected to the connection terminals of the spindle motor 20. The control unit (controller IC) of the control circuit board 50 controls the operation of the VCM 24 and the magnetic heads 32 via the board unit 21, and controls the operation of the spindle motor 20 via the connection terminals 54b.

The circuit configuration of the control circuit board 50, the circuit pattern (conductor pattern) including connection pads and wiring lines, and the first electronic component and the second electronic component which are selectively mounted, will now be described.

Figure 2:
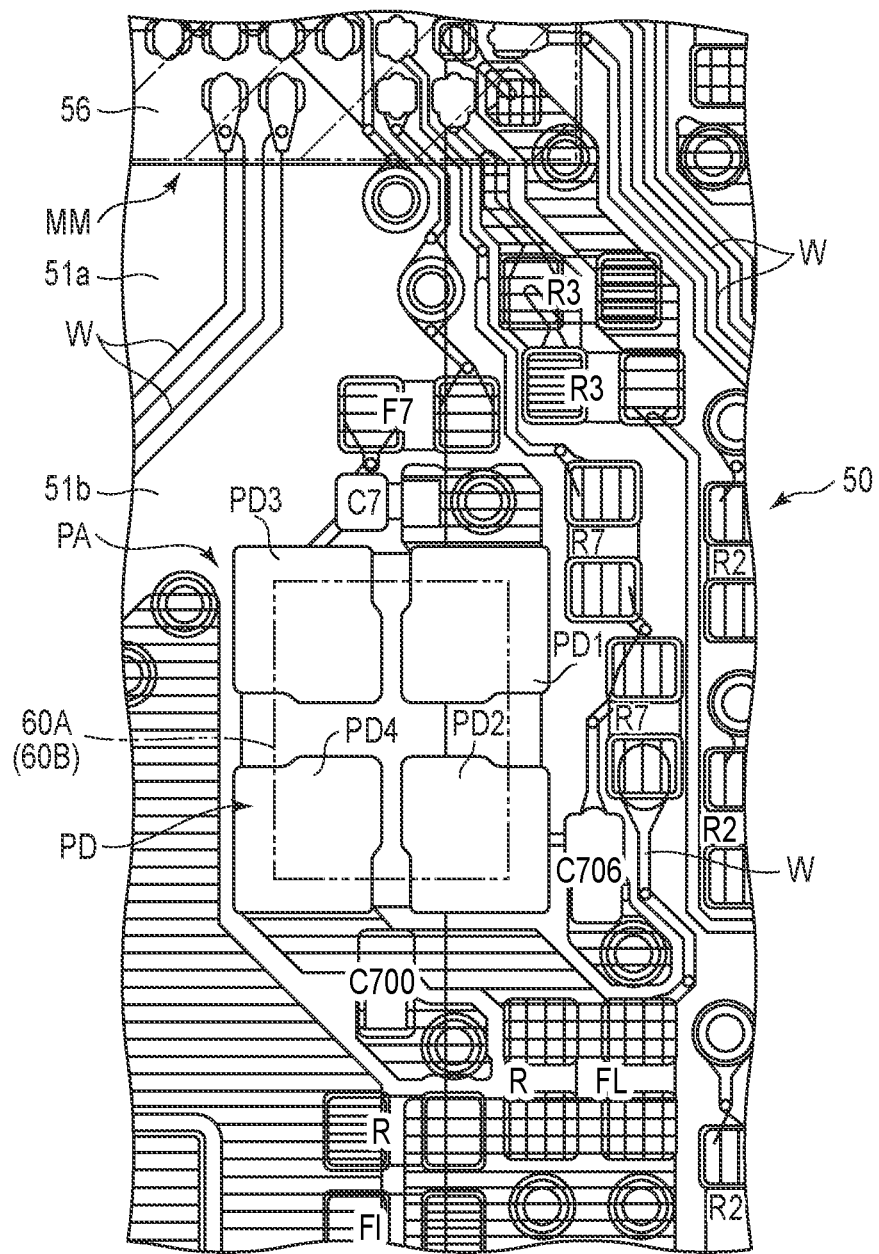
FIG. 2 is a partial plan view of a printed circuit board of the embodiment.

FIG. 2 is a plan view schematically showing a part of the control circuit board 50, and FIGS. 3A and 3B are, respectively, a plan view and a rear view of an oscillator, which is an example of a first electronic component, and FIGS. 4A and 4B are, respectively, a plan view and a rear view of an oscillator, which is an example of a second electronic component.

As shown in FIG. 2, the control circuit board 50 comprises a mounting portion MM on which the controller IC (SoC) 56 is mounted, a shared pad group PA on which the first electronic component and the second electronic component of different sizes can be selectively mounted, a number of wiring lines W connected to the mounting section MM and the shared pad group PA, and a plurality of semiconductor chips such as resistors R each connected to each respective wiring line W. The control circuit board 50 includes an insulating substrate 51a, a conductive layer formed on the insulating substrate 51a, and a resist layer 51b such as a solder resist, overlaid on the conductive layer. For example, by patterning the conductive layer made of copper foil, a circuit pattern including a mounting portion MM, a number of wiring lines W and a shared pad group PA is formed. The shared pad group PA includes a plurality, for example, four shared pads PD.

The control circuit board 50 may be formed of a multi-layer circuit board comprising a plurality of insulating substrates and a plurality of conductive layers which are stacked one on another.

As shown in FIGS. 3A and 3B, a 2520-size resonator 60A, which constitutes an oscillation source 60 of the basic clock of the HDD, is used as an example of the first electronic component. The resonator 60A includes a flat rectangular casing 61a having a length L1 and a width W1 and a plurality of, for example, four connection terminals (electrodes) CT1 exposed on the bottom surface of the casing 61a. For example, the casing 61a is formed to have L1=2.5 mm and W1=2 mm.

The connection terminals CT1 are each formed of, for example, a rectangular-shaped metal plate. The four connection terminals CT1 are placed respectively at the four corner portions of the bottom surface of the casing 61a. The four connection terminals CT1 are located to be spaced apart from each other in the length direction and in the width direction. For example, the connection terminals CT1 have a length LC1=0.7 mm and a width WC1=0.6 mm.

As shown in FIGS. 4A and 4B, a 2016-size oscillator 60B, which constitutes the oscillation source 60 of the basic clock of the HDD, is used as an example of the second electronic component. The oscillator 60B includes a flat rectangular casing 61b having a length L2 and a width W2 and a plurality of, for example, four connection terminals (electrodes) CT2 exposed on the bottom surface of the casing 61b. For example, the casing 51b is formed to have L2=2 mm and W2=1.6 mm.

The connection terminals CT2 are each formed from, for example, a rectangular-shaped metal plate. The four connection terminals CT2 are placed respectively at the four corner portions of the bottom surface of the casing 61b. The four connection terminals CT2 are located to be spaced apart from each other in the longitudinal direction and in the width direction. For example, the connection terminals CT2 have a length LC2=0.5 mm and a width WC2=0.5 mm.

As described above, the size of the first electronic component is different from that of the second electronic component. In the embodiment, the first electronic component is greater in size than the second electronic component. The casing and terminals of the first electronic component are respectively greater in size than the casing and terminals of the second electronic component. In other words, the dimensions of the electronic components and the connection terminals have the following relationships: L1>L2, W1>W2, LC1>LC2 and WC1>WC2.

The resonator 60A and the oscillator 60B described above are selectively mounted on the shared pad group PA of the control circuit board 50 according to the type of the device model.

Figure 5:
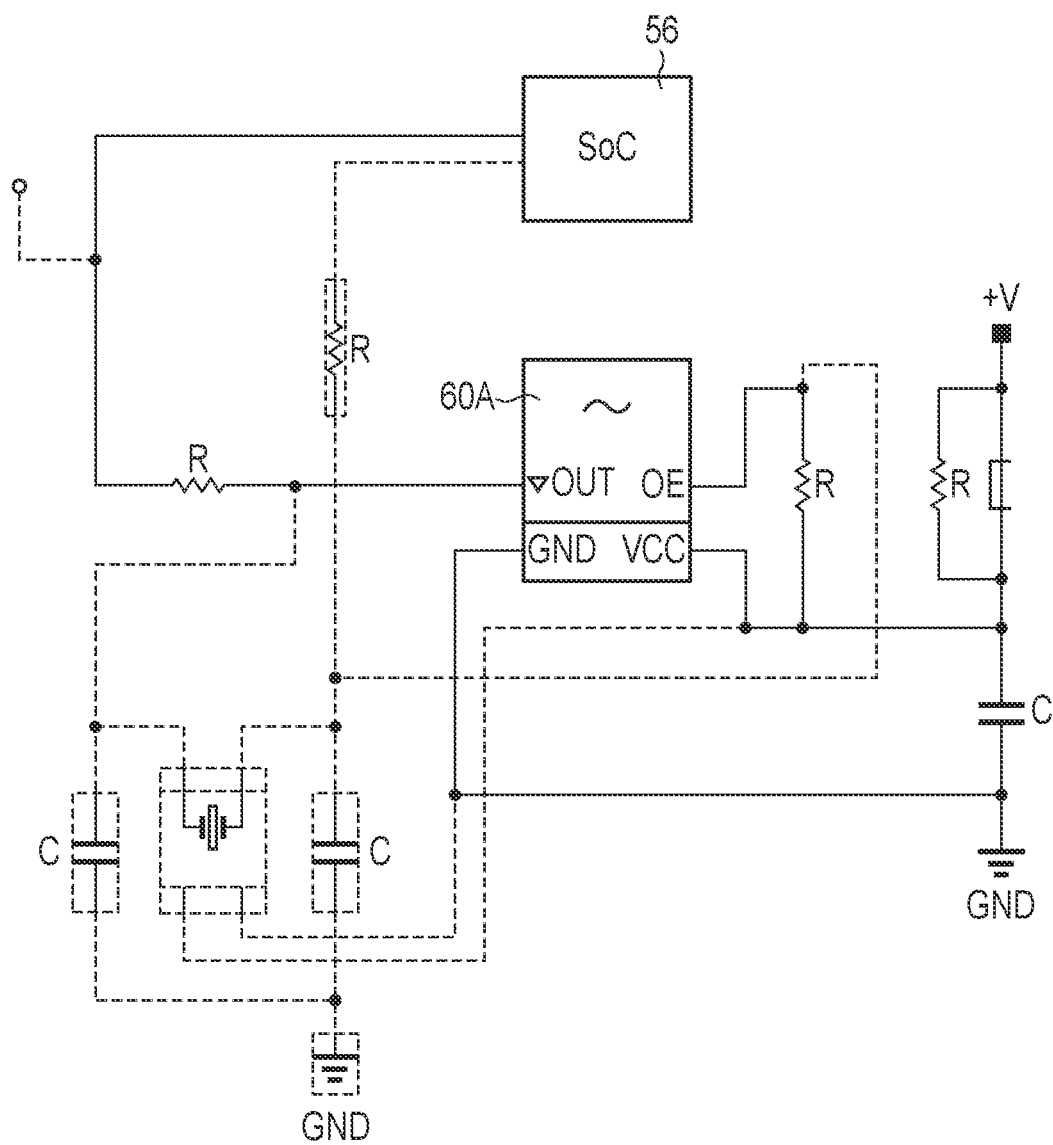
FIG. 5 is a circuit diagram showing a circuit configuration when the first electronic component is mounted on the printed circuit board.
Figure 6:
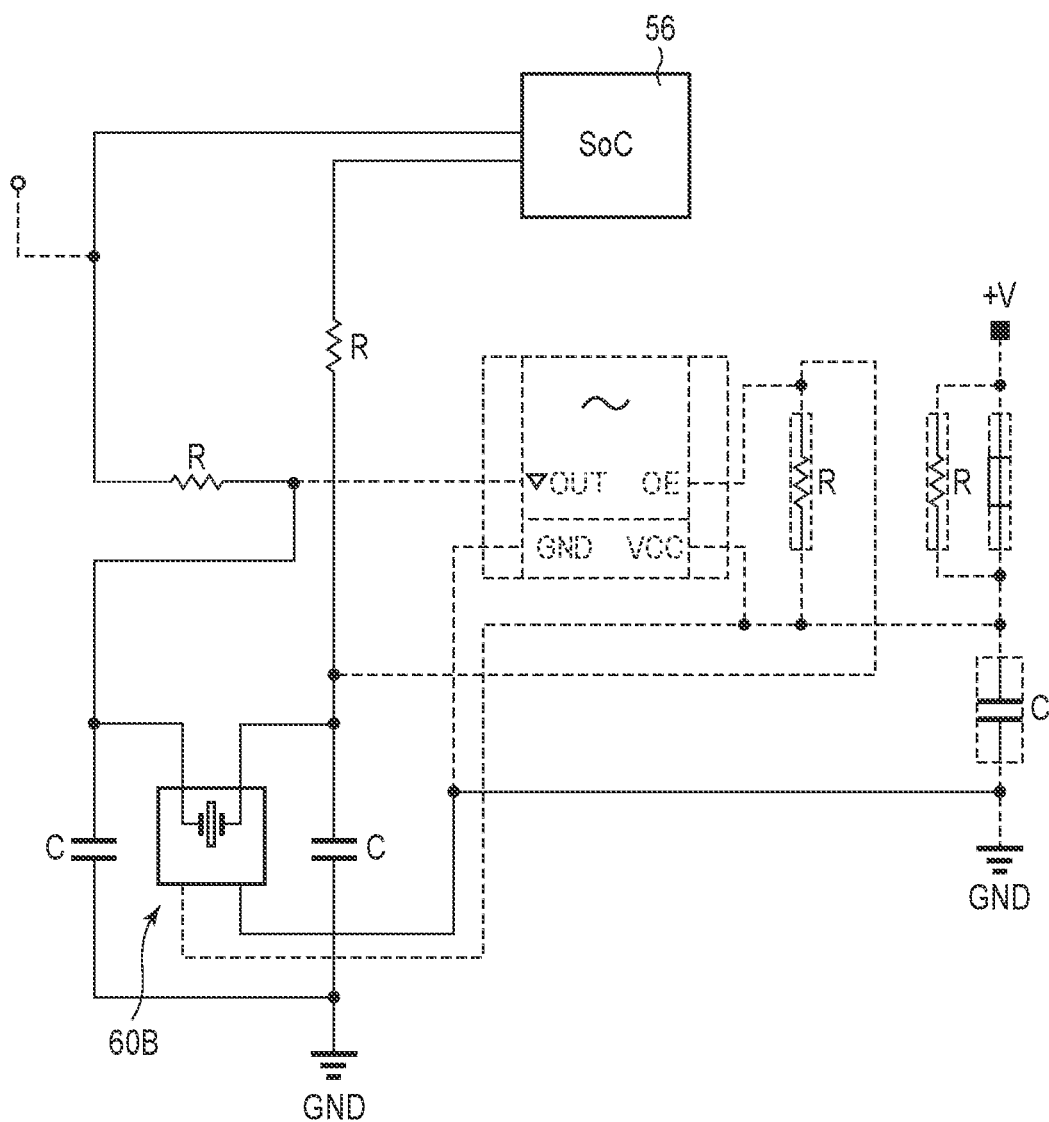
FIG. 6 is a circuit diagram showing a circuit configuration when the second electronic component is mounted on the printed circuit board.

FIG. 5 is a circuit configuration diagram of the control circuit board 50 when the resonator 60A is mounted on the shared pad group PA, whereas FIG. 6 is a circuit configuration diagram of the control circuit board 50 when the oscillator 60B is mounted on the shared pad group PA. In FIGS. 5 and 6, the resonator 60A/the oscillator 60B are illustrated at different positions on circuits, but in the actual device, they are mounted in the same location (the shared pad group PA).

As shown in FIG. 5, when the resonator 60A is mounted on the shared pad group PA, Vout (clock out) of the resonator 60A is connected to the SoC 56 via the wiring lines, resistor R and the like and the ground is connected to GND of the control circuit via the wiring lines. Vcc and OE (output enable) of the resonator 60A are connected to a power source V via the wiring lines, the resistor R and the like, respectively.

In FIG. 5, the wiring lines and semiconductor devices indicated by dashed lines are those which are not yet mounted or connected.

As shown in FIG. 6, when the oscillator 60B is mounted on the shared pad group PA, the input and output (in and out) of the oscillator 60B are connected to the SoC 56 via the wiring lines, the resistor R and the like, respectively. The input and output (in and out) of the oscillator 60B are connected to the GND of the control circuit via the wiring lines, the capacitor C and the like, respectively.

In FIG. 6, the wiring lines and semiconductor devices indicated by dashed lines are those which are not yet mounted or connected.

The configuration of the shared pad group PA will be described in detail.

As described above, the shared pad group PA has such a configuration that electronic components of different sizes, in this case, the resonator 60A and the oscillator 60B can be mounted thereon.

Figure 7:
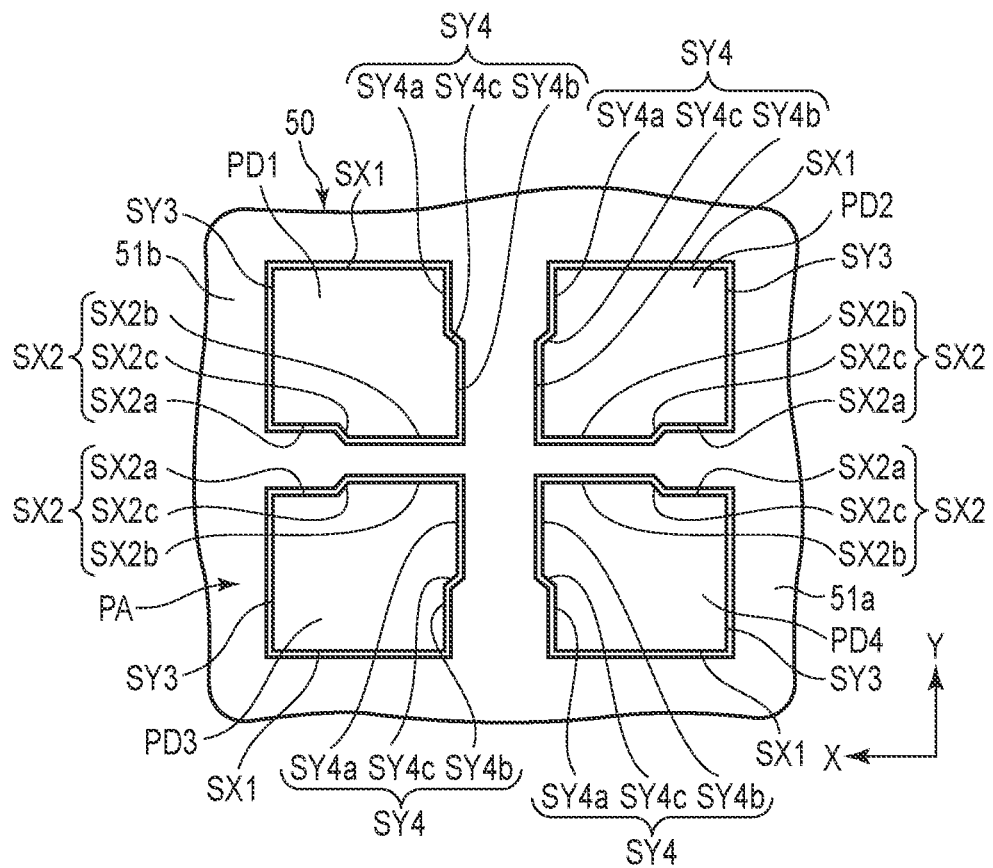
FIG. 7 is a plan view showing a group of common-use pads on the printed circuit board.
Figure 8:
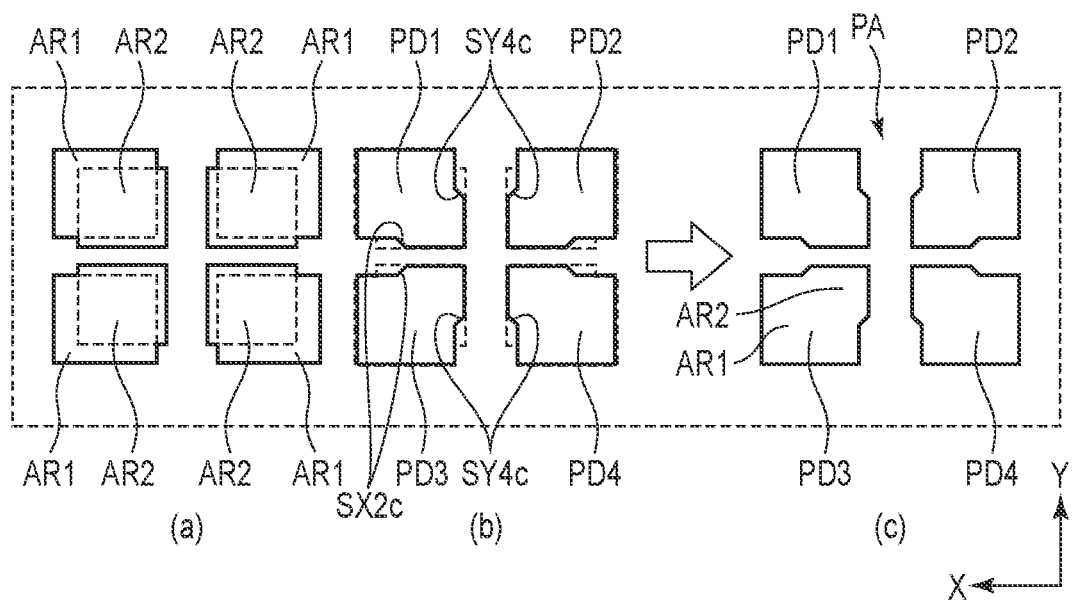
FIG. 8 is a plan view schematically showing a process of forming of the shared pads.

FIG. 7 is an enlarged plan view of the shared pad group PA, and FIG. 8 is a plan view schematically showing the formation process of the shared pads.

As shown in FIG. 7, the control circuit board 50 includes an insulating substrate 51a, a shared pad group PA formed by patterning the conductive layer formed on the insulating substrate 51a, and a resist layer 51b formed on the insulating substrate 51a to cover the conductive layer.

In this embodiment, the shared pad group PA includes, for example, four shared pads PD (a first pad PD1, a second pad PD2, a third pad PD3 and a fourth pad PD4). Note that the first, second, third and fourth pads may be referred to as the shared pads PD. In the drawing, the first direction X and the second direction Y orthogonal to the first direction are defined. Of the four shared pads PD, the first pad PD1 and the second pad PD 2 are disposed to be aligned in the first direction X so as to oppose each other with a gap therebetween. The first pad PD1 and the third pad PD3 are disposed to be aligned in the second direction Y so as to oppose each other with a gap therebetween. The third pad PD3 and the fourth pad PD4 are disposed to be aligned in the first direction X so as to oppose each other with a gap therebetween. The second pad PD2 and the fourth pad PD4 are disposed to be aligned in the second direction Y so as to oppose each other with a gap therebetween.

The four shared pads PD are formed into a polygonal shape, for example, octagonal, in a symmetrical manner to have the same dimensions as each other. The shared pads PD are not covered by the resist layer 51b, and exposed to the first main surface S1 (see FIG. 1) of the control circuit board 50.

As shown in FIG. 7 and FIG. 8, part (a), each of the shared pads PD includes a substantially rectangular first area AR1 having dimensions corresponding to those of the terminal (electrode) CT1 of the resonator 60A, that is, a size by which the terminal CT1 can be amounted, and a substantially rectangular second area AR2 having dimensions corresponding to those of the terminal (electrode) CT2 of the oscillator 60B, that is, a size by which the terminal CT2 can be amounted. The second area AR2 is located to overlap the first area AR1 by its most part. Here, partially, a part of the second area AR2, for example, a corner portion of the second area AR2 protrudes from a corner portion of the first area AR1 in the first direction X and the second direction Y.

As shown in FIG. 7, each of the shared pads PD, for example, the first pad PD1 includes a first pad side edge SX1 and a second pad side edge SX2 each extending in the first direction X and opposing each other with a gap therebetween, and a third pad side edge SY3 and a fourth pad side edge SY4 each extending in the second direction Y and opposing each other with a gap therebetween. The first pad side edge SX1 and the third pad side edge SY3 are each formed in substantially straight lines and orthogonal to each other. The first pad side edge SX1 and the third pad side edge SY3 are located at the outer corner portions of the shared pad group PA.

The second pad side edge SX2 and the fourth pad side edge SY4 are formed as straight lines bent in the middle, and are orthogonal to each other. The second pad side edge SX2 and the fourth pad side edge SY4 form corner portions located at the central portion of the common pad group PA.

The second pad side edge SX2 includes a first side edge SX2a, a sloping side edge SX2c and a second side edge SX2b. The first side edge SX2a is orthogonal to the third pad side edge SY3 and thus defines the first area AR1. The second side edge SX2b is orthogonal to the fourth pad side edge SY4 and thus defines the second area AR2. The second side edge SX2b is located to protrude or displace to a side of the third pad PD3 adjacent in the second direction Y by a predetermined distance with respect to the first side edge SX2a.

As shown in FIG. 7 and FIG. 8, part (b) and part (c), in the second pad side edge SX2 of the first pad PD1, the corner portions where the first area AR 1 and the second area AR2 are connected, are notched diagonally. In other words, the first side edge SX2a and the second side edge SX2b, which respectively define the first area AR1 and the second area AR2, are connected via the sloping side edge SX2c, which is inclined with respect to the first direction X and the second direction Y.

As shown in FIG. 7, the fourth pad side edge SY4 includes the first side edge SY4a, the sloping side edge SY4c and the second side edge SY4b. The first side edge SY4a is orthogonal to the first pad side edge SX1 and defines the first area AR1. The second side edge SY4b is orthogonal to the second pad side edge SX2 and defines the second area AR2. The second side edge SY4b is located to protrude or displace to the side of the second pad PD2 adjacent in the first direction X by a predetermined distance with respect to the second side edge SY4b.

As shown in FIG. 7 and FIG. 8, part (b) and part (c), in the fourth pad side edge SY4 of the first pad PD1, the corner portions where the first area AR 1 and the second area AR2 are connected, are notched diagonally. In other words, the first side edge SY4a and the second side edge SY4b, which respectively define the first area AR1 and the second area AR2, are connected via the sloping side edge SY4c, which is inclined with respect to the first direction X and the second direction Y.

The second, third and fourth pads PD2, PD3 and PD4 are formed to have the same dimensions and shape as those of the first pad PD1. The first pad PD1 and the second pad PD2 are formed and disposed in a line symmetrical manner with respect to the central axis line extending in the second direction Y. The third pad PD3 and the fourth pad PD4 are formed and disposed in a line symmetrical manner with respect to the central axis line extending in the second direction Y in relation to the first pad PD1 and the second pad PD2.

As shown in FIG. 7, the second pad side edge SX2 of the first pad PD1 opposes parallel to the second pad side edge SX2 of the third pad PD3 at a predetermined distance. The distance (interval) between the first side edges SX2a opposing each other is greater than the distance (interval) between the second side edges SX2b opposing each other. In the second pad side edge SX2, the second side edge SX2b is closer to the third pad PD3 than the first side edge SX2a.

The fourth pad side edge SY4 of the first pad PD1 opposes parallel to the fourth pad side edge SY4 of the second pad PD2 at a predetermined distance. The distance (interval) between the first side edges SY4a opposing each other is greater than the distance (interval) between the second side edges SY4b opposing each other. In the fourth pad side edge SY4, the second side edge SY4b is closer to the second pad PD2 than the first side edge SY4a.

Note that in this embodiment, the distance between the second pad side edges SX2 of the shared pads is set narrower than the distance between the fourth pad side edges SY4. The intervals may be the same, and can be changed in various ways according to the electronic components to be mounted on the shared pad group PA.

Figures 9A, 9B:
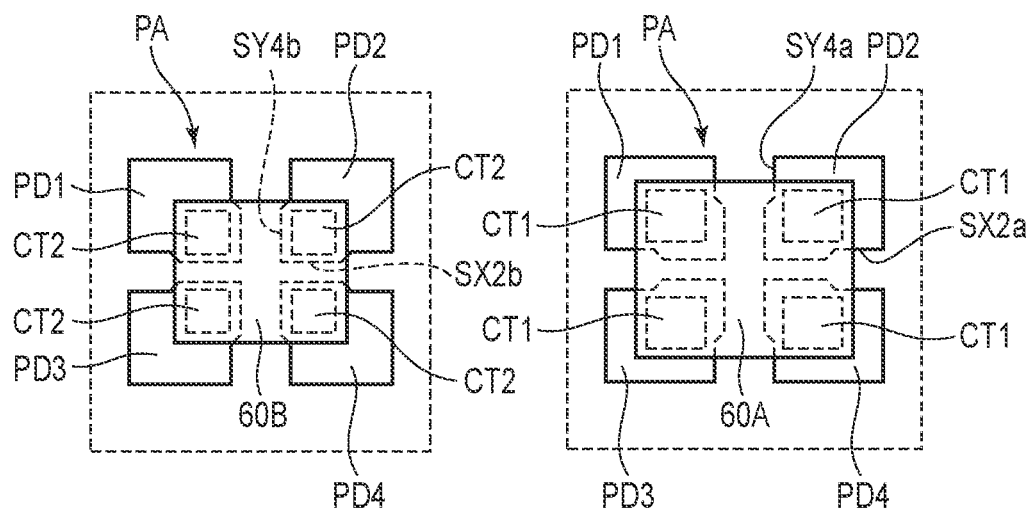
FIG. 9A is a plan view schematically showing a state where the first electronic component is mounted on the group of shared pads.
FIG. 9B is a plan view schematically illustrating a state where the second electronic component is mounted on the shared pad group.

FIGS. 9A and 9B are each a plan view of a state where electronic components are mounted on the shared pad group PA.

As shown in FIG. 9A, when the oscillator 60B is mounted on the shared pad group PA, the four terminals (electrodes) CT2 of the oscillator 60B are soldered to the second areas AR2 of the four shared pads PD1 to PD4, respectively. By melting the solder layer formed on the shared pads PD1 to PD4 in advance, the terminals CT2 are soldered to the shared pads PD1 to PD4.

When soldering, the terminals CT2 of the oscillator 60B are guided to the second side edges SX2b and SY4b of the second areas AR2 of the shared pads PD1 to PD4, and are soldered to the desired positions without misalignment.

As shown in FIG. 9B, when the resonator 60A is mounted on the shared pad group PA, the four terminals (electrodes) CT1 of the resonator 60A are soldered to the first areas AR1 of the four shared pads PD1 to PD4, respectively. By melting the solder layers provided on the shared pads PD1 to PD4 in advance, the terminals CT1 are soldered to the shared pads PD1 to PD4.

When soldering, the terminals CT1 of the resonator 60A are guided the first side edges SX2a and SY4a of the first areas AR1 of the shared pads PD1-PD4, and are soldered to the desired positions without misalignment.

According to the control circuit board and HDD of this embodiment configured as described above, a plurality of electronic components of different sizes are mountable on a shared pad group. With this configuration, a common control circuit board 50 can be applied to multiple models of HDDs. Here, there is no need to provide both a pad group exclusive for the first electronic component and a pad group exclusive for the second electronic component on the control circuit board, thereby reducing the number of pad groups, downsizing the control circuit board and reducing design costs.

By forming the shared pads PD into a shape compatible with the respective terminals (electrodes) of electronic components of different sizes, the creation of solder balls and misalignment in mounting can be suppressed and soldering errors can be suppressed. In particular, even for large-sized electronic components, the terminals can be guided to respective predetermined positions by the side edges of the shared pad PD, thereby making it possible to suppress the misalignment in mounting of electronic components. Thus, the reliability of mounting electronic components can be improved and the inspection time for misalignment in mounting can be shortened.

Further, by making the portion of the side edge connecting the first area and the second area of the shared pad into a sloped side edge, the wettability of solder to the second area can be improved and even small electronic components can be mounted stably.

As described above, according to this embodiment, it is possible to obtain a printed circuit board on which electronic components of different sizes can be stably mounted and a disk device comprising the same.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the shapes of the first area and the second area of the shared pad are not limited to rectangular, but can be changed in various ways depending on the shape of the terminals (electrodes). The sloping side edge connecting the side edge of the first area and the side edge of the second area is not limited to a straight shape, but may be curved.

The size (L, W) of the shared pad is not limited to that of the embodiment described above, but can be changed in various ways according to the size of the terminals of the electronic component to be mounted. The number of shared pads PD in the shared pad group PA is not limited to four, but can be increased or decreased according to the number of terminals of electronic components to be mounted.

What is claimed is:

1. A printed circuit board comprising:
a substrate; and
a shared pad group provided on the substrate and including a plurality of shared pads,
the plurality of shared pads each comprising a first area, a second area smaller in size than the first area, a port of which is located to overlap the first area and an other port of which is located to protrude from the first area to a side of another one of the shared pads, a first pad side edge extending in a first direction and defining the first area and the second area, and a second pad side edge extending in a second direction intersecting the first direction and defining the first area and the second area,
the first pad side edge including a first side edge defining the first area, a second side edge defining the second area and displaced on a side of another shared pad with respect to the first side edge, and a sloping side edge connecting the first side edge and the second side edge to each other.

2. The printed circuit board of claim 1, wherein
the second pad side edge of the shared pad includes a first side edge defining the first area, a second side edge defining the second area and displaced on a side of another shared pad with respect to the first side edge, and a sloping side edge connecting the first side edge and the second side edge to each other.

3. The printed circuit board of claim 2, wherein
the sloping side edge extends in a straight line.

4. The printed circuit board of claim 2, wherein
the first area of the shared pad has a rectangular shape, the second area has a rectangular shape having a size smaller than that of the first area, and one corner of the second area and two of the second side edges intersecting each other at the corner protrude from one corner of the first area to a side of the other of the shared pads.

5. The printed circuit board of claim 2, wherein
the shared pad group includes four of the shared pads,
two of the shared pads are disposed such that the first pad side edges thereof oppose each other with a gap therebetween, and
other two of the shared pads are disposed such that the second pad side edges oppose the second pad side edges of the two of the shared pads.

6. A printed circuit board comprising: a substrate; and a pad group provided on the substrate and including a first pad, a second pad aligned with the first pad in a first direction and a third pad aligned with the first pad in a second direction that intersects the first direction, the first pad and the second pad being each formed into an n-polygonal shape (n is six or more) and include first side edges opposing each other with a gap therebetween and second side edges opposing each other with a gap therebetween, a distance between the first side edges being greater than a distance between the second side edges, the second side edge of the first pad being located adjacent to the second pad as compared to the first side edge of the first pad.

7. The printed circuit board of claim 6, wherein
the third pad is formed into an n-polygonal shape (n being six or more),
the first pad and the third pad each include first side edges opposing each other with a gap therebetween and second side edges opposing each other with a gap therebetween,
a distance between the first side edges is greater than a distance between the second side edges, and
the second side edge of the first pad is located adjacent to the third pad as compared to the first side edge of the first pad.

8. A disk device comprising:
a housing with an outer surface;
a rotatable disk-shaped recording medium disposed in the housing;
a head provided in the housing, which processes information with respect to the recording medium; and
a printed circuit board of claim 1, provided to oppose the outer surface of the housing.

9. The disk device of claim 8, wherein
the second pad side edge of the shared pad includes a first side edge defining the first area, a second side edge defining the second area and displaced on a side of another shared pad with respect to the first side edge, and a sloping side edge connecting the first side edge and the second side edge to each other.

10. The disk device of claim 9, wherein
the sloping side edge extends in a straight line.

11. The disk device of claim 9, wherein
the first area of the shared pad has a rectangular shape, the second area has a rectangular shape having a size smaller than that of the first area, and one corner of the second area and two of the second side edges intersecting each other at the corner protrude from one corner of the first area to a side of the other of the shared pads.

12. The disk device of claim 9, wherein
the shared pad group includes four of the shared pads,
two of the shared pads are disposed such that the first pad side edges thereof oppose each other with a gap therebetween, and
other two of the shared pads are disposed such that the second pad side edges oppose the second pad side edges of the two of the shared pads.

13. A disk device comprising:
a housing with an outer surface;
a rotatable disk-shaped recording medium disposed in the housing;
a head provided in the housing, which processes information with respect to the recording medium; and
a printed circuit board of claim 6, provided to oppose the outer surface of the housing.

14. The disk device of claim 13, wherein
the second pad side edge of the shared pad includes a first side edge defining the first area, a second side edge defining the second area and displaced on a side of another shared pad with respect to the first side edge, and a sloping side edge connecting the first side edge and the second side edge to each other.

\* \* \* \* \*